(12) United States Patent
Jain et al.

(10) Patent No.: US 6,304,316 B1
(45) Date of Patent: Oct. 16, 2001

(54) MICROLITHOGRAPHY SYSTEM FOR HIGH-RESOLUTION LARGE-AREA PATTERNING ON CURVED SURFACES

(75) Inventors: Kanti Jain, Hawthorne, NY (US); Nestor O. Framiga, Clifton, NJ (US); Thomas J. Dunn, Mohegan Lake, NY (US)

(73) Assignee: Anvik Corporation, Hawthorne, NY (US)

( * ) Notice: Subject to any disclaimer, the term of this patent is extended or adjusted under 35 U.S.C. 154(b) by 0 days.

(21) Appl. No.: 09/176,920

(22) Filed: Oct. 22, 1998

(51) Int. Cl.[7] ............ G03B 27/42; G03B 27/58; G03B 27/52; G03B 27/04
(52) U.S. Cl. ............ 355/53; 355/47; 355/55; 355/86
(58) Field of Search ............ 355/53.01, 53.1, 355/53.16, 53.2, 53.22, 53.26, 53.3, 53.5, 47, 53, 55, 72, 86

(56) References Cited

U.S. PATENT DOCUMENTS

| | | | |
|---|---|---|---|
| 3,694,080 | * | 9/1972 | Malsky ............ 355/86 |
| 4,657,350 | * | 4/1987 | Mori ............ 359/494 |
| 4,823,354 | * | 4/1989 | Znotines et al. ............ 372/57 |
| 5,142,132 | * | 8/1992 | MacDonald et al. ............ 250/201.9 |
| 5,285,236 | * | 2/1994 | Jain ............ 355/53 |
| 5,563,684 | * | 10/1996 | Stagaman ............ 355/72 |
| 5,793,473 | * | 8/1998 | Koyama et al. ............ 355/55 |

* cited by examiner

Primary Examiner—Russell Adams
Assistant Examiner—Rodney Fuller
(74) Attorney, Agent, or Firm—Carl C. Kling

(57) ABSTRACT

A projection microlithography system that can pattern very large, curved substrates at very high exposure speeds and any desired image resolution, the substrates being permitted to have arbitrary curvature in two dimensions. The substrate is held rigidly on a scanning stage, on which is also mounted a mask containing the pattern to be formed on the substrate. The mask is imaged on the substrate by a projection subsystem which is stationary and situated above the scanning stage. The mask is illuminated with a polygonal illumination beam which causes a patterned region of similar shape to be imaged on the substrate. Different regions of the substrate are moved in a direction parallel to the direction of the optical axis at the substrate (z-axis) by suitable amounts to keep the segment being exposed within the depth of focus of the imaging lens. The stage is programmed to scan the mask and substrate simultaneously across the polygonal regions so as to pattern the whole mask. Suitable overlap between the complementary intensity profiles produced by the polygonal illumination configuration ensures seamless joining of the scans. This microlithography system includes opto-mechanical mechanisms for dynamically sensing the substrate height at each point, for moving the substrate in the z-dimension, and/or configuring the focal plane of the projection subsystem so as to always keep the substrate region being exposed within the depth of focus of the projection subsystem.

28 Claims, 4 Drawing Sheets

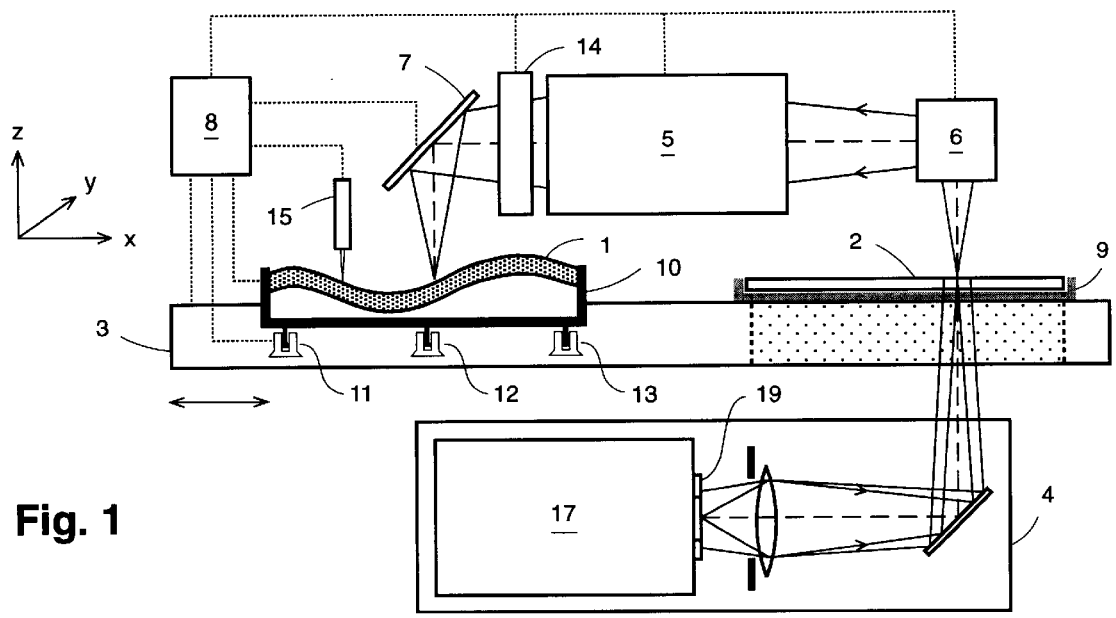
Fig. 1
Fig. 4
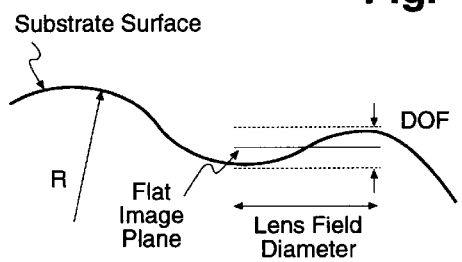
Fig. 5
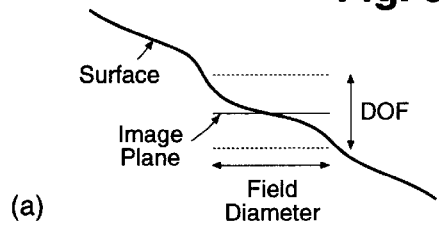
(a)
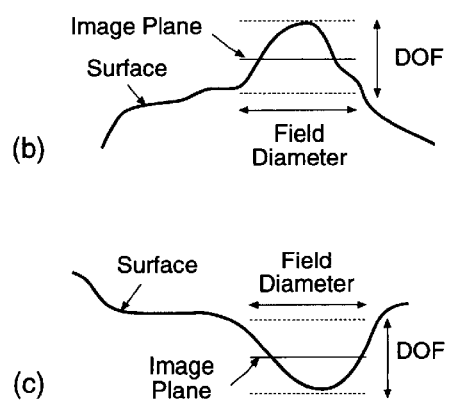
(b)
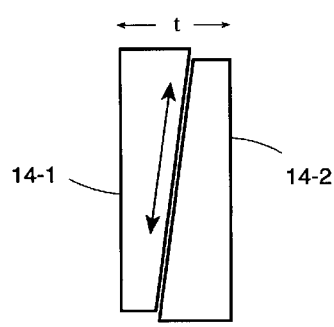
Fig. 6
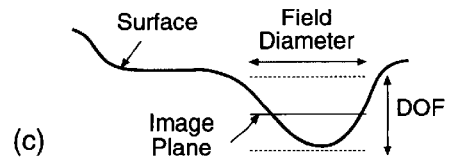
(c)

MICROLITHOGRAPHY SYSTEM FOR HIGH-RESOLUTION LARGE-AREA PATTERNING ON CURVED SURFACES

FIELD OF THE INVENTION

This invention relates to microlithography, and more particularly relates to a projection microlithography system for high-resolution patterning on a large-area, photosensitive substrate having planarity deviations that exceed in magnitude the depth-of-field parameter of the projection imaging optics of the lithography system.

BACKGROUND OF THE INVENTION

Importance of Lithography Technology for Patterning on Curved Surfaces

Large-area electronic, mechanical and electromechanical structures on curved surfaces with integrated functional capability are rapidly growing in significance in a number of applications. In the military environment, this is evidenced by the desire for faster, lighter, and greater-functionality hardware, requiring active electronic circuitry and/or large-area micromechanical structures such as sensors and actuators. In the commercial sector, the availability of active microelectronic devices and micromechanical structures on large surfaces, especially those printed conformably on curved surfaces, holds enormous promise for applications in communications, integrated sensors and controls, and medical sectors. Technologies currently do not exist to produce such devices and structures.

As the level of functionality in a microelectronic or micromechanical device or structure increases, it becomes more important to develop manufacturing technologies and systems that will enable large-area printing on curved substrates at a reasonable cost. The curvature of the substrate may be predetermined and well defined, e.g., a spherical shell of known radius, or it may be random and unknown, e.g., a random, two-dimensional topography variation combining concave and convex regions. Existing approaches are unattractive because they provide very low throughputs (e.g., electron-beam or other focused-beam direct writing), or involve expensive additional process steps (e.g., chemical-mechanical polishing), or have a short depth of focus, and they cannot print conformably (e.g., all existing optical projection lithography techniques). This invention discloses a new lithography technology that enables conformable patterning with high resolution and high throughput on large-area substrates which may have curvature in one or more directions.

In the manufacturing of electronic devices and modules, the production equipment represents a major cost element, accounting for approximately two-thirds of the total facility cost. Of the many process steps involved in the fabrication of such devices, the most critical are those required for successively patterning various layers of photoresist and other materials. The capabilities and cost-effectiveness of the lithography technology impact the performance and cost of the device, and ultimately determine the size and cost at the end-system level. This makes patterning tools the largest and most critical component of the total production equipment investment. Typical costs of individual tools range between $2 and 5 million. A high-volume production facility would have multiple lithography tools. In addition, operating expenses add several hundred thousand dollars per year to the net cost of running such tools. Thus, in order to make significant progress toward broad realization of greater-functionality electronic and mechanical systems, there is a need to develop and implement new high-resolution, high-throughput lithography equipment for conformable patterning on curved, large-area surfaces.

Current Lithography Technologies

Currently available exposure systems can be classified into four general categories: (a) contact and proximity printing systems, (b) various types of projection systems (conventional, step-and-repeat, and scanning), (c) focused-beam direct-writing systems, and (d) holographic imaging systems. Each of these will be briefly described below. A contact printer consists of a fixture to align and hold the substrate in hard contact with the mask which is then illuminated with high-intensity collimated light to transfer the mask image to the substrate. In a proximity system a uniform gap is maintained between the mask and the substrate. Most contact printers use one or two mercury arc lamps, with powers in the range 2–8 kW. The radiation used for exposure is in the UV region from ~250 nm to ~430 nm, the rest of the light in the visible and the infrared being filtered away to minimize heating. The useful UV power represents less than 1% of the total wattage, indicating the extremely poor utilization efficiency of such lamp sources. A major limitation of contact printing is generation of defects on the substrate due to repeated contacting of the resist-coated surface, which results in lower yields. Frequent mask-substrate contact also degrades the mask life, which leads to higher overall costs. These problems are somewhat less severe in proximity printing. However, since the resolution R in a proximity system using radiation of wavelength $\lambda$ depends on the mask-substrate gap d, as given by $R=(\lambda d/2)^{1/2}$, any nonuniformity in the gap results in feature size variation. This limitation becomes more severe for larger panels as it becomes more difficult to maintain a uniform gap between the mask and the substrate. Finally, neither contact nor proximity lithography tools can print on curved surfaces.

A variety of projection imaging systems are used in fabrication of microelectronic modules.

Single-field, or conventional, projection tools are those in which the image field of the lens is sufficient to accommodate the entire substrate. Typically, a projection lens with a 1:1 magnification is used. For different design resolutions, the maximum image field size of the projection lens is different: whereas a 1 mil resolution can be obtained over a 4 inch square field, the imageable area for 1 micron resolution must be limited to a field diameter no larger than 2–3 cm. Thus, conventional projection printing systems are limited by the fundamental trade-off between the desired resolution and the largest substrate they can image.

In a step-and-repeat type of projection system the total substrate area to be patterned is broken up into several segments which are then imaged one at a time by stepping the substrate under the lens from one segment to the next Due to the increased overhead from the stepping, settling and aligning steps for each segment, steppers deliver low throughputs. Most step-and-repeat systems use reduction imaging, typically with a 2:1, 5:1 or 10:1 ratio. Generally, systems with larger reduction ratios provide higher resolution, but also lower throughput. Steppers also have a performance shortcoming due to stitching errors between adjacent exposure segments. When a stepper is used for semiconductor chip lithography, the individual chip sites are separated by nonimaged areas ('streets') through which the chips are diced. Since these streets contain no patterns, there is no requirement to precisely stitch adjacent segments together. However, in a large panel, as for a circuit board or a display, the entire substrate is often one pattern; there are no un-imaged areas between segments. The segments, therefore, must be butted next to each other with great precision. Poor lithography due to stitching errors is one of the most significant yield detractor in the production of large-area products. Recognizing the throughput limitations of steppers, many types of scanning projection tools have been developed over the last two decades. The most well known of these use a reflective ring-field imaging system. Exposures are made by scanning the mask (and the substrate) across an illumination beam in the shape of an annulus, which is necessitated by the geometry of the zone of good image correction. The scanning ring-field imaging concept requires primary imaging mirrors that are approximately three times larger than the size of the substrate. As a result, such scanners, although capable of good resolution, are extremely expensive and incapable of handling most large panel sizes. Their throughputs are also low. Another class of scanning systems use a modified Dyson-type imaging system employing a large beamsplitter, a reduction ratio of 4:1, and separate mask and substrate stages traveling at velocities in the same ratio. These systems, while capable of resolution down to 0.25 $\mu$m, have an individual chip-field-size limitation of ~7 cm$^2$, and have prohibitively high system costs—approaching $10 million. In addition, all projection lithography tools are limited in their ability to image on curved surfaces—the departure from flatness can be no more than the depth of focus.

A focused-beam direct-writing system uses a laser in a raster scanning fashion to expose all the pixels, one at a time, on the substrate. To be compatible with the spectral sensitivity of common photoresists, typically an argon-ion laser operating at one or more of its UV or blue wavelengths is employed. The laser beam is focused on the resist-coated substrate to the desired spot size. The focused spot is moved across the substrate in one dimension with a motor-driven scanning mirror. In conjunction, the stage holding the substrate is translated in the orthogonal dimension with a high-precision stepping motor. Simultaneously, the laser beam is modulated (typically, acousto-optically) to be either directed to the desired location on the substrate or deflected away. Thus, by driving the modulator and the two motors with appropriately processed pattern data, the entire substrate can be directly patterned. Of the many focused-beam direct-write systems currently available, the offered resolution varies from several microns for board patterning to under a micron for systems designed for mask-making applications for IC lithography. Since transfer of the pattern information by such tools takes place in a slow, bit-by-bit serial mode, typical substrate exposure times can range from 2 minutes to several hours per sq. ft., depending upon the resolution and the complexity of the pattern data. Direct-write systems, therefore, are suitable only for applications such as mask fabrication and prototyping, and highly unattractive for cost-effective volume manufacturing.

Holographic imaging systems utilize a mask which is a hologram of the pattern to be imaged, such that when "played back", it projects the original pattern onto the substrate. The mask is generated by encoding the diffraction pattern from a standard mask in a volume hologram. Generally, for all but the simplest patterns, fabrication of the holographic mask requires numerous processing steps. In a holographic lithography system, the burden of imaging is placed entirely on the mask. Holographic imaging systems suffer from poor diffraction efficiency and are applicable, at best, for imaging of very periodic patterns of not very high resolution. If the pattern is not periodic, the imaging resolution degrades. Holographic masks are also considerably more expensive to generate, which is made further prohibitive when masks for many different layers are required for the substrate.

Related Prior Art

Large-area exposure systems that eliminate all of the above limitations have been described by this inventor in his previous patents, including: U.S. Pat. No. 4,924,257, Scan and repeat high-resolution lithography system, issued May 8, 1990; U.S. Pat. No. 5,285,236, Large-area, high-throughput, high-resolution projection imaging system, issued Feb. 8, 1994; and U.S. Pat. No. 5,652,645, High-throughput, high-resolution, projection patterning system, issued Jul. 29, 1997. In these patents, the inventor has described exposure systems that can pattern large substrates by an efficient seamless scanning technique. The illumination system is designed to produce a hexagonal exposure region. Seamless joining of scans is achieved by partial overlap between adjacent scans, which produces a uniform exposure of the entire panel due to integration of complementary intensity profiles. The systems described in these prior patents are attractive for patterning substrates which can be rigid or flexible, and be in the form of discrete panels or as a continuous sheet-roll fed from one roller and taken up by another roller after exposure. However, in all cases, the area being patterned in one exposure operation must be planar, i.e., it must be flat within the limited depth of focus of the projection lens. There is currently no lithography system which can image a substrate whose surface curves in two dimensions and the curvature is orders of magnitude greater than the depth of focus of the projection lens. As already pointed out above, a system that provides the capability to pattern curved substrates will be a significant advantage in the manufacturing of electronic modules. This invention describes such a system.

SUMMARY OF THE INVENTION

This invention describes a projection imaging system that can pattern very large, curved substrates at very high exposure speeds and any desired image resolution, the substrates being permitted to have arbitrary curvature in two dimensions. The substrate is held rigidly on a scanning stage, on which is also mounted a mask containing the pattern to be formed on the substrate. The mask is imaged on to the substrate by a 1:1 projection system which is stationary and situated above the scanning stage. The mask is illuminated from below with a hexagonal illumination beam which causes a patterned region of similar shape to be imaged on the substrate. Different regions of the substrate are moved in a direction parallel to the direction of the optical axis at the substrate (z-axis) by suitable amounts to keep the segment being exposed within the depth of focus of the imaging lens. The stage is programmed to scan the mask and substrate simultaneously across the hexagonal regions so as to pattern the whole mask. Suitable overlap between the complementary intensity profiles produced by the hexagonal illumination configuration ensures seamless joining of the scans.

Important novel elements of this lithography system include opto-mechanical mechanisms for moving the substrate in the z-axis and/or configuring the focal plane of the projection lens so as to always keep the substrate segment being exposed within the depth of focus of the lens. The key requirements in the design of these mechanisms are that first, the surface curvature is at each point on the substrate must be determined and second, the substrate must be moved and/or the optical system adjusted such that the substrate region being illuminated is within the depth of focus of the projection lens. This invention describes several embodiments for accomplishing these requirements.

It is thus the object of this invention to provide a high-throughput, high-resolution, projection patterning system for large, curved substrates for production of electronic devices.

It is another object of the invention to provide an exposure system that images large, curved substrates by overlapping seamless scanning using a small-field projection system and a single planar stage assembly.

It is a more specific object of this invention to provide opto-mechanical mechanisms for moving the substrate in a direction orthogonal to its surface and for configuring the focal plane of the projection lens so as to always keep the substrate segment being exposed within the depth of focus of the lens.

A feature of the invention is a functionally integrated implementation of an illumination means to produce a uniform hexagonal illumination, a two-dimensional scanning stage to enable seamless exposure of large, curved substrates, and means to move different regions of the curved substrate to keep each region within the depth of focus of the imaging system.

Another feature of the invention is the provision of a surface profile measurement means to determine the curvature of the substrate surface at each location.

Another feature of the invention is the provision of a variable-focal-plane imaging system capable of fine-tuning the focal plane of the projection lens.

Another feature of the invention is the provision of certain z-axis actuators that enable different regions of the substrate to move by different amounts along the optical axis.

Still another feature of the invention is the provision of a deformable optical element in the imaging system capable of providing a curved focal plane so as to compensate for the curvature of the substrate.

An advantage of the invention is that it provides the ability to pattern large substrates which have a surface curvature in one or more directions, thereby enabling fabrication of electronic modules on non-planar surfaces, e.g., spherical shells.

Another advantage of the invention is that it provides the capability of patterning large substrates with very high throughputs and the desired resolution, thus eliminating the limitations of existing patterning tools.

While the invention has been presented in embodiments incorporating the features described above, other objects, features and advantages of the invention will be apparent to those skilled in the art from the written description and claims and the attached drawings.

DRAWINGS AND TABLES

FIG. 1 is a schematic illustration of one embodiment of the invention, showing a substrate with a vastly exaggerated curvature mounted in a holder with controlled z-motion capability. The substrate surface is characterized for its topography by a profilometer and is imaged with a projection system incorporating a variable phase plate.

FIG. 4 illustrates the problem solved by this invention, namely the challenge of imaging on a curved substrate whose deviation from planarity is of greater magnitude than the depth of focus (DOF) of the projection system.

FIG. 5 shows the mapping of the image plane of the projection lens to the substrate. Based on the substrate curvature data determined by the profilometer, the substrate is optimally positioned in the z-direction so that its surface in the exposure region is within the depth of focus (DOF) of the projection lens.

FIG. 6 depicts an embodiment of a fine-tuning means to vary the focal plane of the imaging system. The device shown is a variable phase plate assembly incorporating two wedged plates that slide with respect to each other to provide an adjustable optical path length.

Figure 7:
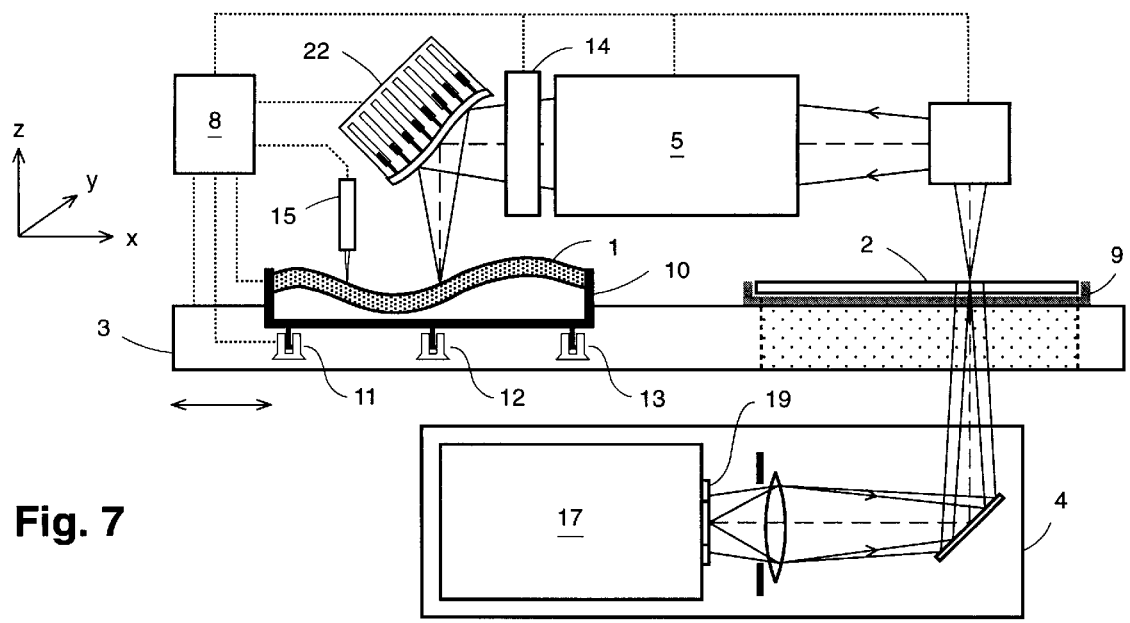

FIG. 7 is a schematic of an embodiment of the invention that includes means to provide variable z-motion capability to the substrate, a variable phase plate assembly for fine focal-plane tuning, and a deformable mirror device to provide a curved image plane. Based on the substrate curvature data determined by the profilometer, the z-motors, the variable phase plate, and the deformable mirror work in combination to provide the optimum mapping of the image plane to the substrate during the entire exposure operation.

Figure 8:
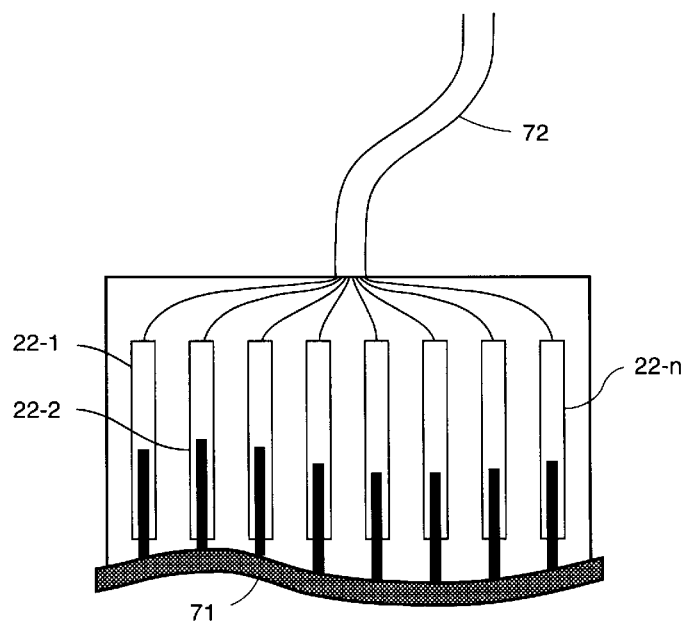

FIG. 8 provides a detailed illustration of a deformable mirror, showing the reflective element mounted on an array of piezo electric actuators that adjust individually to produce the desired mirror curvature.

Figure 9:
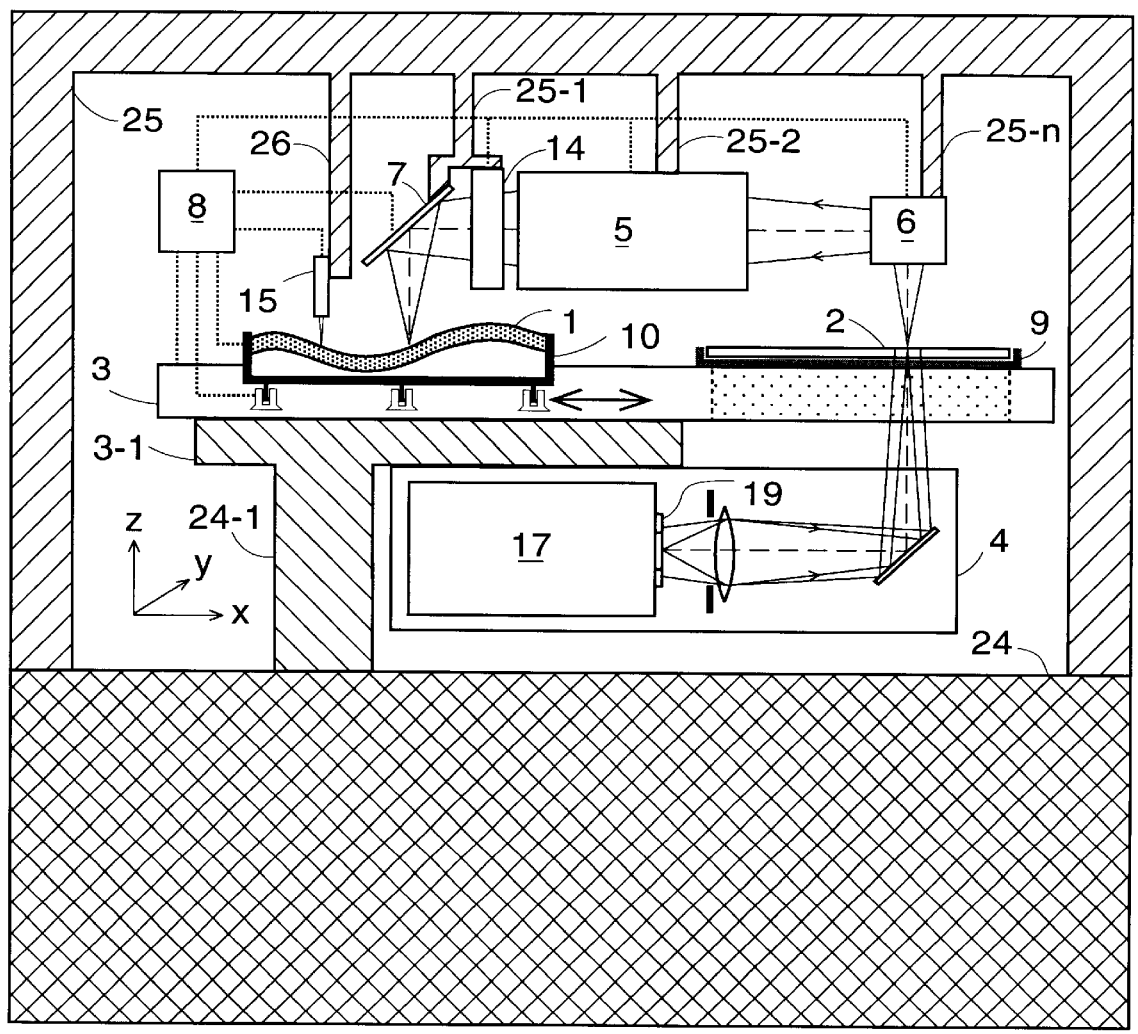

FIG. 9 shows the bridge structure supporting stationary elements above the moving stage.

Table 1 presents the design specifications of a representative lithography system that can be constructed based upon the disclosed invention.

DETAILED DESCRIPTION OF THE PREFERRED EMBODIMENTS

FIG. 1 shows a schematic of the new lithography system for patterning on curved substrates. The substrate 1 and mask 2 are held side-by-side on the same scanning stage 3 and are moved in a series of scans in a serpentine fashion through the object and image fields of the projection lens 5. The imaging path includes a reversing device 6 which ensures that the image on the substrate is in the same orientation as the mask pattern. In order to keep the center of the image field of the lens 5 in focus on the substrate 1, the substrate holder 10 is actuated along the z-direction during each scan. Built into the substrate holder 10 of the scanning stage 3 are a suitable number of motors 11–13 that move the substrate 1 in the z-direction. The motion of the z-motors 11–13 and the scanning action of the stage 3 are synchronized to locate the image field of the projection lens 5 so as to ensure that every point within the image field is within the depth of focus (DOF). Later in this description, we illustrate how the required z-motion is determined.

Figure 2:
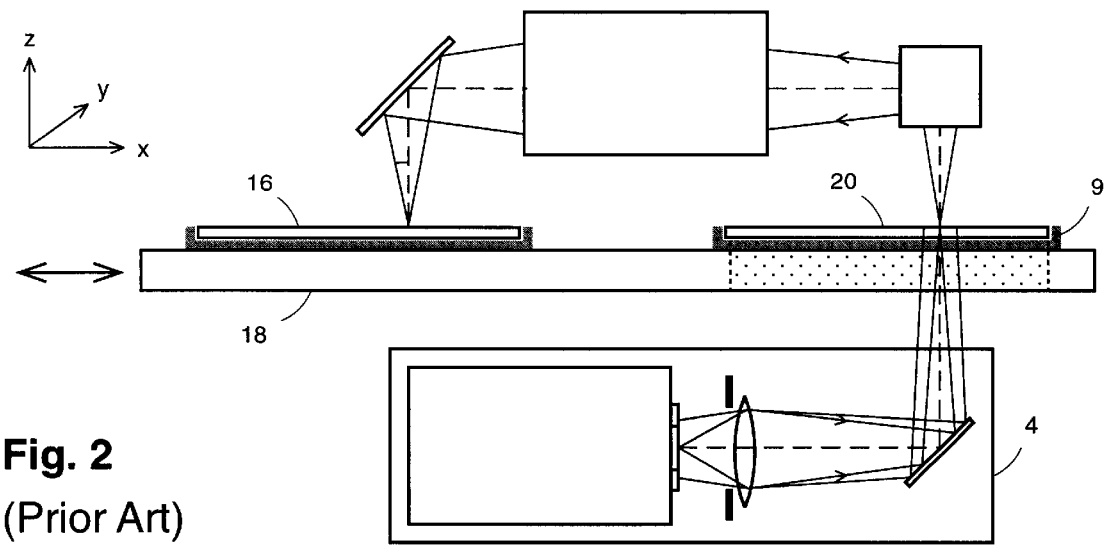
FIG. 2 depicts a prior-art microlithography system, patented by one of the co-inventors of this application, that is capable of large-area projection imaging using a seamless, scan-and-repeat exposure mechanism.
Figure 3:
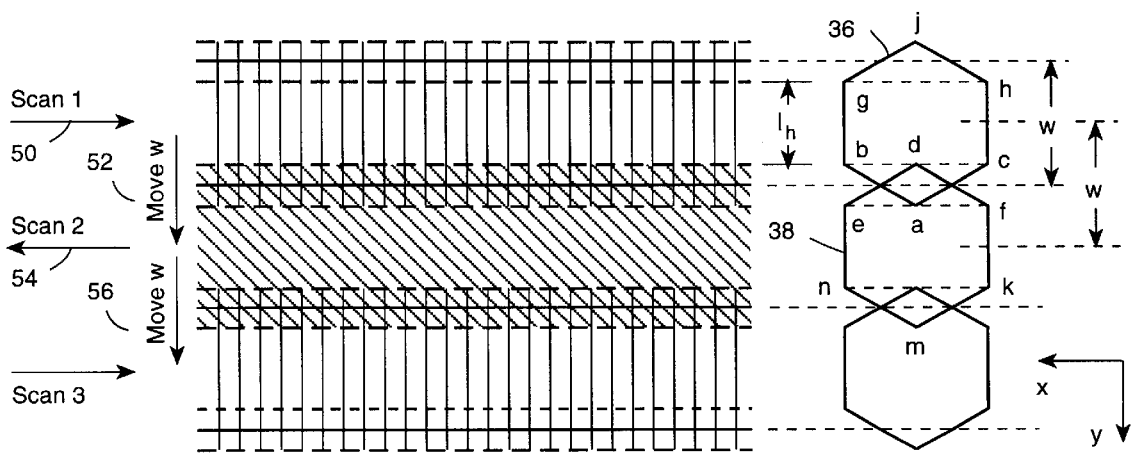
FIG. 3 shows how the seamless scanning technology of prior art works, indicating complementary overlap between adjacent scans carried out with a hexagonal illumination beam.

Before going into further details on the elements of the invention that relate to curved surfaces, we summarize the technology of seamless scanning exposure mechanism that has been described in detail in previous patents (cited above) issued to one of the inventors (K. Jain). As shown in FIGS. 2 and 3 (prior art), the single planar stage 18 (FIG. 1) causes the mask 20 and the substrate 16 to scan in unison along the x-axis across their respective illuminated regions to traverse the length of the substrate 16. The illumination system 4 is designed to produce a hexagonal illumination region on the mask 20 through clear openings in stage 18 and mask holder 9. After a scan, stage 18 moves along the y-axis by an effective scan width (shown as w, 52, in FIG. 3). Now the substrate 16 and mask 20 are again scanned along x as before, after which they are laterally moved along y, and the process is repeated until the entire substrate is exposed. In FIG. 3, the hexagons 36 and 38 represent the illuminated regions on the substrate for scans 1 (50) and scan 2 (54). The y-movement after each x-scan is given by w=1.5 $l_h$, where $l_h$ is the side-length of the illumination hexagon. In scan 1, the region swept by the rectangular portion b-g-h-c of hexagon 36 is not overlapped by any portion of scan 2. However, the region swept by the triangular segment a-b-c of hexagon 36 in scan 1 is re-swept in scan 2 by the triangular segment d-e-f of hexagon 38. When the doses from these triangular segments are integrated, the cumulative exposure dose anywhere in the overlapping region is the same as in the non-overlapping regions, thus producing a seamless, uniform exposure over the whole substrate.

We have described above the advantages of our prior-art hexagonal seamless scanning technique for projection imaging of a mask pattern to a substrate which has a flat surface that is also coplanar with the object field of the projection lens. The challenge addressed by this invention is to pattern on a surface which is neither coplanar with the object field nor flat In order to illustrate the challenges of patterning on curved substrates, we first describe the underlying issues. We show in FIG. 4 the top surface of a substrate with an arbitrary curvature along one dimension and the flat image field of a conventional projection lens. The Rayleigh limit for the depth of focus (DOF) of a projection lens is determined by the wavelength of illumination λ and the numerical aperture (NA) of the projection lens, and is given by the following relation:

$$DOF = \pm 0.5 \lambda / (NA)^2. \quad (1)$$

As an example, a projection lens designed for patterning 1 μm features using a 248 nm light source would typically have a 0.17 numerical aperture and the depth of focus for such a lens would be ±4 μm.

If we assume that the center of the image field is properly focused on the substrate as shown in FIG. 4, then, in order for the features everywhere in the image field to remain acceptably in focus, the curvature of the substrate must stay within the DOF of the projection lens. For a flat field, the allowed curvature of the substrate is determined by the size of the image field and by the DOF of the projection lens. We can show that the allowed radius of curvature R for the substrate is given by the expression:

$$R = 0.5 (l_h)^2 / DOF \quad (2)$$

where $l_h$ is the radius of the lens field in a conventional lithography system and, which, in the case of the seamless scanning systems described in the prior patents cited above, is also equal to the length of one side of the illumination hexagon. Equation (2) shows that a projection lens which has an 8 mm diameter field and which can image 1 μm features with a depth of focus of ±4 μm can pattern on a substrate with a radius of curvature of 1 meter. The above analysis illustrates how the maximum acceptable local curvature is calculated.

It must be emphasized that in previous systems the long-range departure of the substrate surface from planarity must still be within the DOF. The challenge addressed in this invention is how one may image on a surface whose long-range profile deviates more than the DOE limit.

As already mentioned, in order to keep the center of the image field in focus on the substrate at all times, the lithography system of this invention includes means for the substrate holder to be actuated along the z-direction during each scan. To determine the required z-motion so that the focal plane can be correctly placed, the system also includes a surface profile measurement capability. As shown in FIG. 1, a surface profilometer 15 is incorporated in the system; it determines the height variation while the substrate 1 is scanned so that the surface topography can be measured prior to moving the substrate in the z-direction. The topography information from the profilometer 15 is processed by a control system 8 which directs the set of motors 11–13 built into the substrate holder 10 of the scanning stage 3 to move the substrate 1 in the z-direction by the necessary amounts. The movements of the z-motors 11–13 and the scanning action of the stage 3 are synchronized so as to ensure that every point on the substrate 1 within the image field is within the depth of focus (DOF).

Additionally, we use a variable phase plate 14 to assist in moving the focal plane with respect to the substrate. FIG. 1 shows the variable phase plate 14 between the fold mirror 7 and the projection lens 5. Working in combination with the z-motors 11–13 in the substrate holder 10, the variable phase plate helps perform fine-tuning of the focus adjustment to accommodate the given curvature with the desired accuracy. This will be described in more detail later along with another complementary fine-tuning technique; both techniques can be implemented to obtain the desired accuracy in focal plane mapping.

The combined actions of the surface profilometer 15, the coarse z-positioning implemented by the substrate holder 10, and the fine-tuning of the focal plane are all performed synchronously to keep the focal plane properly situated with respect to the substrate 1. We show in FIG. 5 the optimum focal position for the image plane depending on the local topography of the substrate that is currently in the image field of the projection lens. If the local terrain of the substrate has a relatively constant slope as shown in FIG. 5(a), then the control system (8 in FIG. 1) will cause the center of the image field to focus on the surface of the substrate. If the local topography in the image field of the projection lens has a relative maximum near the center of the image field, then the system will focus the center of the image field below the surface of the substrate as shown in FIG. 5(b). FIG. 5(c) shows how the image field will be focused above the substrate if the substrate has a local minimum near the center of the image field.

Referring again to FIG. 1, during the course of a scan the substrate 1 will be moved up and down in real time as the substrate and mask are scanned in unison through the image field and object field, respectively, of the projection lens 5. In principle, the substrate can be moved up and down with enough speed and accuracy to track the profile changes as the scanning stage 3 moves the substrate through the lens image field. In practice, the z-motors 11–13 are used to follow only the coarse changes in the height of the substrate, and other means are implemented to perform the fine tuning. There are two different embodiments which we will describe that will allow the focal plane of the projection lens to track the fine changes of the substrate profile variation and to keep the substrate within the depth of focus. The first approach, as already briefly outlined above, is to use the variable phase plate 14 shown in FIG. 1, and the second approach is to tune the wavelength of the laser light source in the illumination system 4 to effectively shift the focal plane of the projection lens 5.

Fine-tuning of the Focal Plane

The variable phase plate 14 in FIG. 1 serves to change the location of the focal plane with respect to the substrate 1 by moving the focal plane of the projection lens 5 up and down in the vertical direction. The phase plate is in the imaging path between the projection lens 5 and the fold mirror 7. If the refractive index or the thickness of the phase plate is changed, the focal plane will shift. As an example, consider a variable phase plate (with refractive index=1.5) which is in the imaging path of a projection lens with a back focal distance of 200 mm. If we increase the effective length of the phase plate from 10 mm to 10.5 mm, the focal plane will shift by 167 $\mu$m. Similarly, if we change the index of refraction from 1.5 to 1.55, the focal plane will shift by 215 $\mu$m. The shift in focal length given in these examples is much larger than would be required in a lithography system that may be built in practice embodying this invention. The z-motion of the substrate holder 10 would provide the coarse movements that are needed, and the variable phase plate 14 would only enable fine adjustments. Therefore, the nominal thickness of the phase plate would be known prior to design of the projection lens, so that any aberrations that may be introduced by the plate can be compensated a priori in the design of the imaging system.

One technique to configure the variable phase plate is shown in FIG. 6. It uses a variable phase plate assembly consisting of two plates 14-1 and 14-2, each with a small wedge angle, which are moved relative to each other to effectively change the relative thickness of the assembly. It is also possible to use electro-optic techniques to vary the index of a bulk material, thereby changing the optical path length.

In another embodiment of the invention the technique used to vary the image plane of the projection lens 5 consists in exploiting both the inherent dispersion of the projection lens and the tuning ability of a narrow spectral bandwidth light source. For example, in FIG. 1, the light source 17 in the illumination system 4 can be a narrow bandwidth krypton fluoride (KrF) excimer laser which uses a line-narrowing module 19 consisting of an aperture and a diffraction grating assembly integrated with the laser system. The grating allows the user to tune the line-narrowed laser across the bandwidth of the KrF laser transition. We exploit this tuning ability for fine focus adjustments. A slight change in the wavelength of the illumination will result in a shift of the focal plane due to the dispersion of the projection lens 5. This can be done without any detrimental effect on the image quality. As an actual quantitative example, in a 1 $\mu$m resolution projection lens that we designed and built using all fused silica elements, a 10 pm shift of the wavelength produced a 4 $\mu$m shift in the focal plane. Since the laser can be tuned across hundreds of picometers, this technique can be implemented to shift the focal plane by as much as 100 $\mu$m. This technique is also extremely sensitive and repeatable, and can be used in combination with the variable phase plate 14 to provide a finer adjustment of the focal plane. It can also be very fast since the wavelength is changed by tilting a grating through a small range of angles. Finally, it has the advantage that it does not introduce any additional elements into the imaging system.

Measurement of Surface Topography

In order to be able to move the substrate 1 and the image plane of the projection lens 5 to the correct z-position, it is important to be able to accurately characterize the surface profile of the substrate 1. This function is performed by the surface profilometer 15 shown in FIG. 1. The surface profilometer 15 consists of a non-contact sensing unit which is rigidly fixed on the same mechanical structure that holds the imaging system. The sensing unit relies on the same scanning motion of the stage 3 to move the substrate 1 under the head of the profilometer 15 as is used to pattern the substrate. The wavelength of the light source used in the sensing unit is outside the spectral range of photosensitivity of the substrate; for most photoresists which are sensitive in the UV, the detector light source can be a He—Ne laser emitting in the red. The sensing unit shown in FIG. 1 is displaced with respect to the imaging beam so that it measures the profile of the substrate 1 along a line which is centered along the imaging region of the next scan. In this manner, all the information required to actuate the substrate 1 is acquired before the exposure scan begins.

In the above embodiment it is necessary to perform an additional scan in order to read the height information for the first scan before beginning the patterning. An alternative approach is to position two different height-sensing units on either side of the imaging region such that the centers of the units and the image field are on a line which is parallel to the direction of the scan. In this approach, one sensing unit is used to detect the height of the substrate just before entering the image field when scanned in one direction, and the other unit is used when scanning in the opposite direction. There are several known techniques which can be used for height sensing, including optical triangulation devices, optical focusing systems, and confocal microscopy.

Creating a Non-planar Image Field

We next describe how we can decrease the allowable local radius of curvature of the substrate, e.g., below 1 m when patterned by an imaging system with an 8 mm field diameter and which is capable of resolving 1 $\mu$m lines and spaces. In this embodiment we use a non-planar image field which is varied to match the local topography of the substrate. This will enable the lithography system to accommodate a much higher degree of substrate curvature. Additionally, when the image field is matched to the substrate topography, very little of the DOF budget is utilized, making the lithography system much more robust from a process window point of view.

In principle, one technique that can be used to change the curvature of the image field is to incorporate some weak cylindrical optics into the projection lens which can be moved to change the curvature independently in X and Y. In practice, this would be difficult to implement without significantly affecting the imagery performance. If a substrate of known, fixed curvature is specified, such as for a wing section or a cockpit window of an aircraft, then the lens can be more easily designed to generate the permanently curved image field which best matches the profile of the substrate. In the most general case, when the curvature of the substrate is either variable or not known, such a technique would be difficult. However, using the embodiment we describe next, it is still possible to generate a curved image field to match the local surface topography of the substrate. As shown in FIG. 7, this is accomplished by replacing the fold mirror 7 in FIG. 1 with a deformable mirror 22 which serves to create an image field with the appropriate curvature so as to optimally match the curvature of the substrate 1.

FIG. 9 shows schematically how the typical system also comprises a mechanically stable base structure 24, on which the stage subsystem 3, 3-1 is mounted. Bridge structure 25, 25-1, 25-2 ... 25-n is mounted to the base structure 24. The projection subsystem 5 is mounted to the bridge structure 25-2. The surface profiling means 15 is mounted to the bridge structure 25, 26 so as to have a constant locational relationship with the projection subsystem 5.

A deformable mirror consists of a thin reflective substrate which has an array of piezo actuators which serve to introduce small changes in the curvature of the reflective surface. We show in FIG. 8 a cross-section of such a mirror. The mirror surface 71 is deformed in real-time in response to the changing topography of the substrate surface to be patterned. The piezo-actuators 22-1, 22-2, ..., 22-n move in response to the data collected by the surface profilometer 15 (FIG. 7) and received by the deformable mirror 22 through link 72 regarding the height variation of the region of the substrate 1 which is currently in the image field of the projection lens 5. As the stage 3 scans the substrate through the image field, each pulse of laser 17 sees a slightly different curvature of the deformable mirror surface 71 which has been programmed to match the substrate profile in the image field.

In summary, we have disclosed above several embodiments of a novel, high-resolution lithography system that is capable of high-speed patterning on large-area substrates that may be curved in one or more directions. The numerous advantages of the system of this invention over prior-art lithography tools can be summed up as follows:

(i) The ability to optimally adjust the curvature of the image field of the projection lens to match the surface topography of the substrate allows this lithography system to pattern on substrates with very high degrees of curvature. This advantage is further enhanced by the system's ability to exploit the nonlinear relationship between the image field of the projection lens and the allowed curvature of the substrate.

(ii) With its unique hexagonal exposure field and continuous scanning movement, the new system enables patterning of substrates of practically any desired size, eliminating field size constraints of conventional projection tools. Because of the hexagonal illumination configuration and maximum image field utilization, this system also delivers high throughputs using small-size optics modules, thus keeping system costs low.

(iii) With its seamless overlap between adjacent scans, critical stitching errors which are characteristic of conventional step-and-repeat tools, are eliminated. Due to its 'batch' exposure mode, the new system also eliminates the severe throughput limitations of focused-beam direct-write systems which expose pattern pixels in a serial fashion.

(iv) Being a projection system, it circumvents the traditional problems of contact printing tools, namely defect generation on the panel, degradation of the mask, cumbersome alignment process, and long vacuum pull-down times. It also eliminates the shortcomings of proximity printing tools, namely, limited resolution and feature size variations.

(v) The in-situ surface profilometry system measures the surface topography of the substrate on the fly and enables adjustment of the image focal plane with respect to the substrate in real-time to accommodate the substrate curvature.

(vi) The means to tip and tilt the substrate, the fine wavefront tuning by the phase plate and the deformable mirror provide the system with a fast, controlled and automatic capability to accommodate a wide range of substrate curvatures in arbitrary directions.

(vii) The desired resolution and substrate size handling capability can be delivered with off-the-shelf optical and mechanical components, thereby eliminating the need for development of complex and expensive lens systems and reducing commercialization risks. This also helps reduce system costs.

(viii) The modular design concept of the system disclosed in this invention permits rapid construction of the lithography system in different user-specified configurations, without requiring an entire new development program for each configuration. The modular design concept also provides upgradability. Unlike most other lithography tools, the major subsystems in the new system are mutually non-interfering and their performance can be taken to a higher level by upgrading the appropriate module without having to retool completely.

METHOD OF OPERATION

The invention describes a method of providing a high-throughput, high-resolution patterning system for large, roll-fed substrates using the following steps:

1. Providing a stage incorporating a substrate holder for holding a photosensitive substrate with a curved surface and a mask holder for holding a flat mask, and capable of scanning longitudinally in one direction, and also capable of moving laterally in a direction perpendicular to the scan direction;

2. Providing an illumination system which produces radiation of the wavelength and intensity required by the photosensitive substrate material, and which produces on the mask an illumination region in the shape of a regular hexagon of side $l_h$ which can be inscribed within the image field of the projection assembly described in step 3 below;

3. Providing a projection imaging assembly of magnification 1:1, which has an image field size that is substantially smaller than the substrate size, and which is designed to produce a 1:1 image of the illuminated region of the mask on the substrate with the required resolution;

4. Providing an optical reversing unit which, in conjunction with the projection assembly of step 3, helps produce an image on the substrate that is in the same orientation as the object pattern on the mask;

5. Providing a scanning surface profile measurement means capable of determining the topography of any selected region of the of the substrate prior to an exposure scan covering that region;

6. Providing actuators in the substrate holder capable of tipping and tilting the substrate, the actuators operating with input signals from the surface profile measurement system in such manner as to continually adjust the substrate to keep its surface optimally close to the image focal plane of the projection lens during the exposure sequence described in steps 8–10 below;

7. Providing phase-adjusting optical means in the imaging path for adjusting the curvature of the image wavefront so that, operating with input signals from the surface profile measurement system and working in conjunction with the substrate z-actuators, the image wavefront is optimally matched to the topography of the substrate during the exposure sequence of steps 8–10 below;

8. Scanning the stage so that the length of the mask traverses across the hexagonal illumination region described in step 2;
9. Stopping the stage momentarily after completion of a scan across the length of the mask, moving the stage by a distance of 1.5 $l_h$ in a direction perpendicular to the scan direction, and resuming the scanning of the stage in a direction opposite to the scan direction in step 5;
10. Repeating steps 8 and 9 until exposure of the entire substrate is completed.

For additional precision in patterning, the method of operation may further include the step of periodically realigning the mask and substrate relative to each other during the steps 8–10 above.

System Design Example

In this section, we present an example of a system design based on this invention. We describe the design parameters, both optical and mechanical, for the system, and also discuss the hardware subsystems suitable for incorporating in the tool. Table 1 shows the specifications of a representative system that may be built based on this invention.

The projection system is a 1:1 magnification lens with a numerical aperture of 0.17 which will be capable of imaging 1.0 μm features with a depth of focus of ±4.0 μm. The lens image field size will be designed for 8 mm which will be capable of patterning surfaces with local radius of curvature within 1.0 meter over a 12×12 inch substrate. The light source in the illumination system is a krypton fluoride (KrF) excimer laser operating at a wavelength of 248 nm. Because of the difficulty in achromatization of a high-resolution projection lens at this wavelength, the lens assembly will incorporate only fused silica elements, and the laser will be spectrally line-narrowed and frequency-stabilized. The lens will be telecentric in both object and image spaces. This important feature minimizes distortion effects that could arise as a result of any defocus of the substrate from the ideal image plane.

The image train also includes a reverser and a variable phase plate. The reverser directs the rays from the mask into the projection lens and flips the image across the optical axis so that the pattern illuminating the substrate has the correct orientation for seamless overlapping exposures. The reverser system will be a split-roof configuration which consists of two mirrors oriented at right angles with respect to each other. The unit is tilted at 45 degrees with respect to the mask plane to direct the laser illumination into the projection lens. The variable phase plate will consist of two fused silica wedged plates capable of sliding with respect to each other to provide a movable image focal plane.

The beam delivery system serves to properly configure and deliver the output of the laser to the mask plane. It consists of three subassemblies: a beam shaping system, a homogenizer and a condenser system. The beam shaping unit is an anamorphic assembly, comprising cylindrical and spherical lenses, which converts the rectangle-like output of the laser to a square beam with roughly equal divergence in both axes. The beam propagates over the required distance to reach the homogenizer. Near the homogenizer entrance the beam passes through a focusing lens which determines the numerical aperture that is used to illuminate the mask and how the laser beam couples into the projection lens. This plays a significant role in determining the modulation transfer function of the imaging system and, consequently, its performance at different spatial frequencies.

The homogenizer is a reflective-type system that uses a hexagonal light tunnel constructed from high-reflectivity dielectric mirror strips. The homogenizer serves to uniformize the laser beam while preserving the numerical aperture determined by the beam shaping system. The condenser system projects the output of the homogenizer onto the mask. It consists of two or tree spherical lenses. All of the optics in the illumination and imaging systems are coated with high-damage-threshold dielectric coatings, anti-reflective for lens element surfaces and high-reflectivity for mirror surfaces. The total energy efficiency from the laser to the substrate is estimated to be about 50%.

The translation stage system will be an air-bearing X-Y stage mounted on a granite reference base, which in turn will be mounted on a vibration-isolated pneumatic chassis. It will be driven in both directions by linear, brushless, dc motors. The velocity of the stage will be at least 250 mm/sec. The range of travel of the stage will be chosen based on the required substrate dimensions. For a 17 inch diagonal substrate (12×12 inches), we would require a range of travel of about 14×13 inches; this includes the additional longitudinal distance needed for the stage to accelerate and decelerate beyond each scan length of constant velocity and the additional lateral distance needed for the beginning and ending scans.

The profilometer to measure the height variations of the substrate will be a dual-beam laser ranging device that will determine the substrate curvature by an optical triangulation technique. The z-actuators in the substrate holder to tip and tilt the substrate will comprise three fine-pitch, servo-controlled, brushless, DC stepper motors. The deformable mirror assembly will be an astronomical-type unit consisting of several dozen piezoelectric actuators which will be capable of deforming the mirror surface at multiple locations in controlled amounts so to, in conjunction with the actions of the substrate holder z-actuators and the variable phase plate, optimally match the substrate curvature.

Throughput Estimate

To demonstrate the attractive throughput of the lithography system disclosed in this invention, we present the following analysis based on realistic parameters. We use the projection lens assembly described above, with its design resolution of 1 μm and an image field diameter of 8 mm. The length of a side of the hexagonal exposure field, $l_h$, is half of the image field diameter. Thus, $$l_h = 4 \text{ mm.}$$

The effective scan width w, as defined previously, is then $$w = 1.5 l_h = 6 \text{ mm.}$$

If the scan speed is $v_s$, then the raw exposure throughput (i.e., without taking into account any non-exposure overhead time), defined as the area A exposed per unit time, is given by $$A = w \, v_s.$$

The appropriate scan speed is determined by the resist sensitivity and the available exposure intensity on the substrate. We use a resist sensitivity of $$D_s = 150 \text{ mJ/cm}^2,$$

with the remark that many commonly used resists in representative thicknesses are often exposed with much lower doses. To estimate the UV power incident on the panel, we use a conservative value of η=50% for the net optical efficiency of the optical train. This gives a value of 2.5 W for the power incident on the panel. For the above combination of hexagonal image field size, resist sensitivity and incident power, the stage can be used at speeds up to 25 cm/sec.

The raw exposure throughput then can be estimated to be $$A=15 \text{ cm}^2/\text{sec}=1 \text{ sq.ft/min.}$$

The final important parameter that enters the throughput calculation is $t_{oh}$, the total overhead time per panel, which includes the load, unload and alignment times. Using $t_{oh}$=10 sec and a scanned exposure area of 12×12 inches per panel, the net throughput can be estimated to be $$W=42 \text{ panels/hr.}$$

We remark that, in comparison with currently available lithography tools, not only is the throughput that we have just calculated several times greater, but is also for patterning on curved surfaces, which cannot be accomplished with present tools.

TABLE 1

| | |
|---|---|
| Projection System | 1:1 magnification telecentric refractive lens |
| Numerical Aperture | 0.17 |
| Resolution | 1.0 μm @ $k_1$ = 0.7 |
| Depth of Focus | 8.5 μm |
| Lens Image Field Size | 8 mm diameter |
| Substrate Size Capability | 300 × 300 mm (12 × 12 inches), extendible to larger areas |
| Illumination System Wavelength | 248 nm |
| Illumination Source | Krypton Fluoride Excimer Laser |

We claim:

1. A high-resolution, scan-and-repeat, projection microlithography system for replicating patterns present on a mask (2) onto a large-area photosensitive substrate (1) having a nonplanar surface, characterized by (a) a stage subsystem (3) comprising a mask holder (9) with locking means for the mask (2) and a substrate holder (10) with locking means for the substrate (1), providing fixed juxtaposition of the mask (2) relative to the substrate (1), said stage subsystem (3) being capable of scanning in one dimension, and when not scanning in that dimension, capable of moving laterally in a direction perpendicular to the scan direction so as to position itself for another scan; said stage subsystem (3) thus being capable of exposing the full substrate (1) by breaking up the substrate area into a number of parallel strips, and exposing each of said strips by scanning the length of the strip across a fixed illumination region;

(b) an illumination subsystem (4) having an effective source plane of a selected shape, and capable of illuminating on said mask (2) a region of said selected shape;

(c) a projection subsystem (5) for imaging said illuminated region of said selected shape on the mask onto the substrate, having an object-to-image magnification ratio of substantially unity, having the desired imaging resolution, capable of rendering the image in the same orientation as the object, and having an image field of said selected shape and of an area smaller than the substrate (1) area;

(d) said substrate holder (10) having means for varying the altitude and orientation of any region of the substrate (1) so as to bring the substrate region being exposed within depth of focus of the projection subsystem (5); and (e) control means (8) to operatively interrelate said stage subsystem (3), illumination subsystem (4), projection subsystem (5), and substrate holder (10) so as to position the substrate and provide additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

2. A projection microlithography system for patterning high-resolution features on large-area, non-planar surfaces according to claim 1, further characterized in that (a) said illumination subsystem (4) has an effective source plane in the shape of a regular hexagon, and illuminates a regular-hexagon-shaped region on said mask (2), and said regular-hexagon-shaped region on the mask (2) is so oriented that two of its six sides are perpendicular to the scan direction;

(b) said projection subsystem (5) has an image field in the shape of a regular hexagon, and said regular-hexagon-shaped image field is so oriented that two of its six sides are perpendicular to the scan direction; and (c) the effective width, w, of each scan, as defined by the lateral separation between the center lines of two adjacent scans, is given by $$w=1.5 \ l_h,$$

where $l_h$ is the length of each side of said regular-hexagon-shaped illuminated region on the substrate (1).

3. A projection microlithography system for patterning high-resolution features on large-area, non-planar surfaces according to claim 1, further characterized in that said illumination subsystem (4) provides radiation from a mercury lamp.

4. A projection microlithography system for patterning high-resolution features on large-area, non-planar surfaces according to claim 1, further characterized in that said illumination subsystem (4) provides pulsed radiation from an excimer laser.

5. A projection microlithography system for patterning high-resolution features on large-area, non-planar surfaces according to claim 1, further characterized in that said stage subsystem (3) comprises a substantially planar stage with a first position for said mask (2) and a second position for said substrate (1), the two positions being aligned in substantially the same plane for imaging by said projection subsystem (5).

6. A projection microlithography system for patterning high-resolution features on large-area, non-planar surfaces according to claim 1, further characterized in that said stage subsystem (3) comprises a dual-platform stage with a first position on a first platform for said mask (2) and a second position on a second platform for said substrate (1), the two positions being aligned in parallel planes for imaging by said projection subsystem (5).

7. A high-resolution, scan-and-repeat, projection microlithography system for replicating patterns present on a mask (2) onto a large-area photosensitive substrate (1) having a non-planar surface, characterized by (a) a stage subsystem (3) comprising a mask holder (9) with locking means for the mask (2) and a substrate holder (10) with locking means for the substrate (1), providing fixed juxtaposition of the mask (2) relative to the substrate (1), said stage subsystem (3) being capable of scanning in one dimension, and when not scanning in that dimension, capable of moving laterally in a direction perpendicular to the scan direction so as to position itself for another scan; said stage subsystem (3) thus being capable of exposing the full substrate (1) by breaking up the substrate area into a number of parallel strips, and exposing each of said strips by scanning the length of the strip across a fixed illumination region;

(b) an illumination subsystem (4) having the wavelength and intensity distribution characteristics suited for exposure of said substrate (1), having an effective source plane of a selected shape, and capable of illuminating on said mask (2) a region of said selected shape;

(c) a projection subsystem (5) for imaging said illuminated region of said selected shape on the mask onto the substrate, having an object-to-image magnification ratio of substantially unity, having the desired imaging resolution, capable of rendering the image in the same orientation as the object, and having an image field of said selected shape and of an area smaller than the substrate (1) area;

(d) said substrate holder (10) comprising a set of z-actuators (11–13) for varying the altitude and orientation of any region of the substrate (1) so as to bring the substrate region being exposed within depth of focus of the projection subsystem (5); and (e) control means (8) to operatively interrelate said stage subsystem (3), illumination subsystem (4), projection subsystem (5), and substrate holder (10) so as to position the substrate and provide additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

8. A projection microlithography system for patterning high-resolution features on large-area, non-planar surfaces according to claim 1, further characteized in that information relating to the surface profile of the substrate (1) is available to said control means (8) prior to mounting of the substrate in said substrate holder (10), and said control means (8) uses such information to determine command signals to be provided to said substrate holder (10) so as to position the substrate such that during exposure each substrate region is within the imaging depth of focus of said projection subsystem (5).

9. A high-resolution, scan-and-repeat, projection microlithography system for replicating patterns present on a mask (2) onto a large-area photosensitive substrate (1) having a nonplanar surface, characterized by (a) a stage subsystem (3) comprising a mask holder (9) with locking means for the mask (2) and a substrate holder (10) with locking means for the substrate (1), providing fixed juxtaposition of the mask (2) relative to the substrate (1), said stage subsystem (3) being capable of scanning in one dimension, and when not scanning in that dimension, capable of moving laterally in a direction perpendicular to the scan direction so as to position itself for another scan; said stage subsystem (3) thus being capable of exposing the full substrate (1) by breaking up the substrate area into a number of parallel strips, and exposing each of said strips by scanning the length of the strip across a fixed illumination region;

(b) an illumination subsystem (4), having an effective source plane of a selected shape, and capable of illuminating on said mask (2) a region of said selected shape;

(c) a projection subsystem (5) for imaging said illuminated region of said predetermined shape on the mask onto the substrate, having an object-to-image magnification ratio of substantially unity, having the desired imaging resolution, capable of rendering the image in the same orientation as the object, and having an image field of said predetemined shape and of an area smaller than the substrate (1) area;

(d) a surface profiling means (15) for sensing height of the substrate (1) in different regions;

(e) said substrate holder (10) having means for varying the altitude and orientation of any region of the substrate (1) so as to bring the substrate region being exposed within depth of focus of the projection subsystem (5);

(f) the substrate height information obtained by said surface profiling means (15) is sent to said control means (8) which uses such information to determine command signals to be provided to said substrate holder (10) so as to position the substrate such that during exposure each substrate region is within the imaging depth of focus of said projection subsystem (5); and (g) said control means (8) also operatively interrelates said stage subsystem (3), illumination subsystem (4), and projection subsystem (5) so as to provide additive illumination in certain overlap regions of areas exposed by adjacent scans such that the effect of the exposure dose delivered in said overlap regions is seamless and the effective exposure dose delivered across the entire substrate (1) is uniform.

10. A projection microlithography system for patterning high-resolution features on large-area, non-planar surfaces according to claim 9, further characterized in that a portion of the information relating to the surface profile of the substrate (1) available to said control means (8) is known prior to mounting of the substrate in said substrate holder (10) without requiring the use of said surface profiling means (15), and said control means (8) uses both the surface-profile prior known information and the information obtained from the surface-profiling means (15) to determine command signals to be provided to said substrate holder (10) so as to position the substrate such that during exposure each substrate region is within the imaging depth of focus of said projection subsystem (5).

11. A projection microlithography system for patterning high-resolution features on large-area, non-planar surfaces according to claim 9, further characterize in that said surface-profiling means (15) operates by a noncontact optical means using a wavelength of light outside the spectral range of the photosensitivity of the substrate (1).

12. A high-resolution, scan-and-repeat, projection microlithography system for replicating patterns present on a mask (2) onto a large-area photosensitive substrate (1) having a nonplanar surface, characterized by (a) a stage subsystem (3) comprising a mask holder (9) with locking means for the mask (2) and a substrate holder (10) with locking means for the substrate (1), providing fixed juxtaposition of the mask (2) relative to the substrate (1), said stage subsystem (3) being capable of scanning in one dimension, and when not scanning in that dimension, capable of moving laterally in a direction perpendicular to the scan direction so as to position itself for another scan; said stage subsystem (3) thus being capable of exposing the full substrate (1) by breaking up the substrate area into a certain number of parallel strips, and exposing each of said strips by scanning the length of the strip across a fixed illumination region;

(b) an illumination subsystem (4) having an effective source plane of a selected shape, and capable of illuminating on said mask (2) a region of said selected shape;

(c) a projection subsystem (5) for imaging said illuminated region of said selected shape on the mask onto the substrate, having an object-to-image magnification ratio of substantially unity, having the desired imaging resolution, capable of rendering the image in the same orientation as the object, and having an image field of said selected shape and of an area smaller than the substrate (1) area;

(d) said substrate holder (10) having means for varying the altitude and orientation of any region of the substrate (1) so as to bring the substrate region being exposed within depth of focus of the projection subsystem (5);

(e) optical focus-tuning means (14) situated in the imaging path to provide fine-tuning of the image focal plane of said projection subsystem (5);

(f) control means (8) to operatively interrelate said stage subsystem (3), illumination subsystem (4), projection subsystem (5), substrate holder (10) and optical focus-tuning means (14) so as to position the substrate, adjust focus and provide additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

13. A projection microlithography system for patterning high-resolution features on large-area, nonplanar surfaces according to claim 12, further characterized in that said illumination subsystem (4) comprises a laser source and said optical focus-tuning means (14) comprises means to tune the wavelength of said laser source.

14. A projection microlithography system for patterning high-resolution features on large-area, non-planar surfaces according to claim 12, further characterized in that (a) it comprises a surface profiling means (15) for sensing height of the substrate (1) in different regions; and (b) the substrate height information obtained by said surface profiling means (15) is sent to said control means (8) which uses such information to determine command signals to be provided to said substrate holder (10) and said optical focus-tuning means (14) so as to position the substrate and adjust focus such that during exposure each substrate region is within the imaging depth of focus of said projection subsystem (5).

15. A projection microlithography system for patterning high-resolution features on large-area, non-planar surfaces according to claim 14, further characterized in that the substrate height information obtained by said surface profiling means (15) is sent to said control means (8) which uses such information to determine the command signals to be provided to said substrate holder (10) and said optical focus-tuning means (14) so as to position the substrate (1) and adjust the optical focus tuning means (14) in such a way that the range of height variation of the substrate (1) in the region of exposure is substantially equal to the imaging depth of focus of said projection subsystem (5).

16. A high-resolution, scan-and-repeat, projection microlithography system for replicating patterns present on a mask (2) onto a large-area photosensitive substrate (1) having a non-planar surface, characterized by (a) a stage subsystem (3) comprising a mask holder (9) with locking means for the mask (2) and a substrate holder (10) with locking means for the substrate (1), providing fixed juxtaposition of the mask (2) relative to the substrate (1), said stage subsystem (3) being capable of scanning in one dimension, and when not scanning in that dimension, capable of moving laterally in a direction perpendicular to the scan direction so as to position itself for another scan; said stage subsystem (3) thus being capable of exposing the full substrate (1) by breaking up the substrate area in to a certain number of parallel strips, and exposing each of said strips by scanning the length of the strip across a fixed illumination region;

(b) an illumination subsystem (4) having the wavelength and intensity distribution characteristics suited for exposure of said substrate (1), having an effective source plane of a selected shape, and capable of illuminating on said mask (2) a region of said selected shape;

(c) a projection subsystem (5) for imaging said illuminated region of said selected shape on the mask onto the substrate, having an object-to-image magnification ratio of substantially unity, having the desired imaging resolution, capable of rendering the image in the same orientation as the object, and having an image field of said selected shape and of an area smaller than the substrate (1) area;

(d) said substrate holder (10) having means for varying the altitude and orientation of a plurality of regions of the substrate (1) so as to bring a substrate region being exposed within depth of focus of the projection subsystem (5);

(e) optical focus-tuning means (14) situated in the imaging path to provide fine-tuning of the image focal plane of said projection subsystem (5);

(f) control means (8) to operatively interrelate said stage subsystem (3), illumination subsystem (4), projection subsystem (5), substrate holder (10) and optical focus-tuning means (14) so as to position the substrate, adjust focus and provide additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

(g) surface profiling means (15) for sensing substrate (1) height information and sending such information to said control means (8), which uses such information to determine command signals to be provided to said substrate holder (10) and said optical focus-tuning means (14) so as to position the substrate and adjust focus such that during exposure so that each substrate region is within the imaging depth of focus of said projection subsystem (5);

(h) a mechanically stable base structure on which said stage subsystem (3) is mounted; and (i) a bridge structure, mounted to said base structure, supporting said projection subsystem (5) and said surface profiling means (15) so that said projection subsystem (5) and said surface profiling means (15) have a constant locational relationship.

17. A projection microlithography system for patterning high-resolution features on large-area, non-planar surfaces according to claim 16, further characterized in that said surface profiling means (15) is mounted such that it senses substrate height information in a scan previous to a current exposure scan.

18. A projection microlithography system for patterning high-resolution features on large-area, non-planar surfaces according to claim 16, further characterized in that said surface profiling means (15) is mounted such that it senses substrate height information in the same scan as a current exposure scan but at a location previous to a current exposure region.

19. A projection microlithography system for patterning high-resolution features on large-area, non-planar surfaces according to claim 17, further characterized in that said surface profiling means (15) comprises a pair of devices one of which is mounted such that it senses substrate height information in a first scan direction and the other senses substrate height information in a second scan direction.

20. A high-resolution, scan-and-repeat, projection microlithography system for replicating patterns present on a mask (2) onto a large-area photosensitive substrate (1) having a nonplanar surface, characterized by (a) a stage subsystem (3) comprising a mask holder (9) with locking means for the mask (2) and a substrate holder (10) with locking means for the substrate (1), providing fixed juxtaposition of the mask (2) relative to the substrate (1), said stage subsystem (3) being capable of scanning in one dimension, and when not scanning in that dimension, capable of moving laterally in a direction perpendicular to the scan direction so as to position itself for another scan; said stage subsystem (3) thus being capable of exposing the full substrate (1) by breaking up the substrate area into a number of parallel strips, and exposing each of said strips by scanning the length of the strip across a fixed illumination region;

(b) an illumination subsystem (4), having an effective source plane of a selected shape, and capable of illuminating on said mask (2) a region of said selected shape;

(c) a projection subsystem (5) for imaging said illuminated region of said selected shape on the mask onto the substrate, having an object-to-image magnification ratio of substantially unity, having the desired imaging resolution, capable of rendering the image in the same orientation as the object, and having an image field of said selected shape and of an area smaller than the substrate (1) area;

(d) adaptive optics means (22) for varying the focus distance of any region of the image of said mask (2) on said substrate (1) so as to bring the substrate region being exposed within depth of focus of the projection subsystem (5); and (e) control means (8) to operatively interrelate said stage subsystem (3), illumination subsystem (4), projection subsystem (5), and adaptive optics means (22) so as to focus the mask image on the substrate and provide additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate band segment (16) is uniform.

21. A projection microlithography system for patterning high-resolution features on large-area, non-planar surfaces according to claim 20, further characterized in that said adaptive optics means (14) is a deformable mirror (71) whose curvature is configured by a set of actuators (22-1, 22-2, . . . , 22-$n$) upon command signals received from said control means (8).

22. A projection microlithography system for patterning high-resolution features on large-area, non-planar surfaces according to claim 20, further characterized in that (a) said substrate holder (10) has means for varying the altitude and orientation of any region of the substrate (1) so as to bring the substrate region being exposed within depth of focus of the projection subsystem (5); and (b) said control means (8) operatively interrelates said stage subsystem (3), illumination subsystem (4), projection subsystem (5), substrate holder (10) and adaptive optics means (22) so as to position the substrate, focus the mask image on the substrate, and provide additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

23. A projection microlithography system for patterning high-resolution features on large-area, non-planar surfaces according to claim 20, further characterized in that (a) it comprises a surface profiling means (15) for sensing height of the substrate (1) in different regions; and (b) the substrate height information obtained by said surface profiling means (15) is sent to said control means (8) which uses such information to determine command signals to be provided to said adaptive optics means (22) so as to focus the mask image on the substrate such that during exposure each substrate region is within the imaging depth of focus of said projection subsystem (5).

24. A projection microlithography system for patterning high-resolution features on large-area, non-planar surfaces according to claim 20, further characterized in that (e) it comprises optical focus-tuning means (14) situated in the imaging path to provide fine-tuning of the image focal plane of said projection subsystem (5); and (b) said control means (8) operatively interrelates said stage subsystem (3), illumination subsystem (4), projection subsystem (5), adaptive optics means (22) and optical focus-tuning means (14) so as to focus the mask image on the substrate, and provide additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

25. A projection microlithography system for patterning high-resolution features on large-area, non-planar surfaces according to claim 22, further characterized in that (a) it comprises a surface profiling means (15) for sensing height of the substrate (1) in different regions;

(b) the substrate height information obtained by said surface profiling means (15) is sent to said control means (8) which uses such information to determine command signals to be provided to said substrate holder (10) and adaptive optics means (22) so as to position the substrate and focus the mask image on the substrate such that during exposure each substrate region is within the imaging depth of focus of said projection subsystem (5).

26. A projection microlithography system for patterning high-resolution features on large-area, non-planar surfaces according to claim 25, further characterized in that (e) it comprises optical focus-tuning means (14) situated in the imaging path to provide fine-tuning of the image focal plane of said projection subsystem (5); and (b) the substrate height information obtained by said surface profiling means (15) is sent to said control means (8) which uses such information to determine command signals to be provided to said substrate holder (10), said adaptive optics means (22) and said optical focus-tuning means (14) so as to position the substrate and focus the mask image on the substrate such that during exposure each substrate region is within the imaging depth of focus of said projection subsystem (5).

27. A microlithography system having a projection subsystem for scanning a sequence of limited-field, high-resolution image on large-area, non-planar surfaces with a known curvature characterized in that said projection subsystem has a permanently curved image field designed with a focal surface corresponding to said known curvature of the substrate.

28. An optical projection system for microelectronics, in which a projection lens subsystem must provide a patterned image onto a substrate with its active surface positioned within a limited depth-of-focus about a focal distance, said substrate surface being subject to positional variations from a nominal focal distance, said projection subsystem having a limited depth of focus at a nominal wavelength, the system having an image plane for imaging onto said substrate surface within said limited depth of focus characterized by a) a laser radiation source (17) providing a patterning output beam of radiation at a nominal wavelength, which passes through the projection lens (5) to impinge on said substrate (1) surface at a nominal focal distance;

b) said projection lens (5) having slightly different image planes for different illumination wavelengths; and c) means to vary the wavelength of said output beam, on-the-fly, during a scan motion, so as to switch image planes, to another focal distance at which the depth of focus encompasses the location of said substrate surface.

* * * * *